(12) United States Patent
Tamamushi et al.

(10) Patent No.: US 8,277,603 B2
(45) Date of Patent: Oct. 2, 2012

(54) MOVE MECHANISM FOR MOVING TARGET OBJECT AND CHARGED PARTICLE BEAM WRITING APPARATUS

(75) Inventors: Shuichi Tamamushi, Kanagawa (JP); Shuichiro Fukutome, Shizuoka (JP)

(73) Assignee: NuFlare Technology, Inc., Shizuoka (JP)

( * ) Notice: Subject to any disclaimer, the term of this patent is extended or adjusted under 35 U.S.C. 154(b) by 1034 days.

(21) Appl. No.: 11/649,753

(22) Filed: Jan. 5, 2007

(65) Prior Publication Data

US 2007/0152169 A1    Jul. 5, 2007

(30) Foreign Application Priority Data

Jan. 5, 2006    (JP) ................................. 2006-000336

(51) Int. Cl.
*C23F 1/00* (2006.01)
*H01L 21/306* (2006.01)
*C23C 16/48* (2006.01)
*C23C 16/52* (2006.01)
*C23C 16/06* (2006.01)
*C23C 16/22* (2006.01)

(52) U.S. Cl. ...................... 156/345.4; 118/696; 118/712; 118/713; 118/723 FE; 156/345.28; 156/345.24

(58) Field of Classification Search ............... 156/345.4, 156/345.28, 345.24; 118/696, 712, 713, 118/723 FE
See application file for complete search history.

(56) References Cited

U.S. PATENT DOCUMENTS

| | | | | |
|---|---|---|---|---|
| 4,818,872 A | * | 4/1989 | Parker et al. ...................... 850/1 |
| 5,047,646 A | * | 9/1991 | Hattori et al. ............. 250/396 R |
| 5,369,348 A | * | 11/1994 | Gennesseaux ................ 318/623 |
| 5,684,360 A | * | 11/1997 | Baum et al. .................... 313/542 |
| 5,876,504 A | * | 3/1999 | Fuji et al. ................... 118/723 E |
| 5,885,747 A | * | 3/1999 | Yamasaki et al. ............. 430/296 |
| 5,900,707 A | * | 5/1999 | Wakui ............................. 318/625 |
| 5,986,264 A | * | 11/1999 | Grunewald ................... 250/310 |
| 5,990,476 A | * | 11/1999 | Larson et al. ................. 250/251 |
| 6,042,738 A | * | 3/2000 | Casey et al. ....................... 430/5 |
| 6,331,885 B1 | * | 12/2001 | Nishi ............................... 355/53 |
| 6,420,701 B1 | * | 7/2002 | Hashimoto ................... 250/305 |
| 6,472,840 B1 | * | 10/2002 | Takahashi ..................... 318/649 |

(Continued)

FOREIGN PATENT DOCUMENTS

JP    62-217686    9/1987

(Continued)

OTHER PUBLICATIONS

Office Action issued by the Korean Patent Office on Apr. 8, 2008, for Korean Patent Application No. 10-2006-0136064, and English-language translation thereof.

(Continued)

*Primary Examiner* — Rudy Zervigon
(74) *Attorney, Agent, or Firm* — Finnegan, Henderson, Farabow, Garrett & Dunner, L.L.P.

(57) ABSTRACT

A move mechanism for horizontally moving a target object in an accelerating manner, includes a moving unit configured to be horizontally moved in an accelerating manner, a plate part arranged on the moving unit and supported by the moving unit at a substantially center-of-gravity height position, and a mirror part configured to reflect a laser beam for measuring a position, the mirror part being connected to the plate part such that a center-of-gravity height position of the mirror part is arranged at the substantially center-of-gravity height position of the plate part.

11 Claims, 13 Drawing Sheets

U.S. PATENT DOCUMENTS

| | | | |
|---|---|---|---|
| 6,497,194 B1 * | 12/2002 | Libby et al. | 118/723 F1 |
| 6,538,254 B1 * | 3/2003 | Tomimatsu et al. | 250/442.11 |
| 6,642,512 B2 * | 11/2003 | Aita | 250/251 |
| 6,979,822 B1 * | 12/2005 | Stewart et al. | 250/310 |
| 6,999,162 B1 * | 2/2006 | Takahashi | 355/75 |
| 7,230,257 B2 * | 6/2007 | Uchida | 250/492.22 |
| 7,554,107 B2 * | 6/2009 | Yoshitake et al. | 250/492.22 |
| 2005/0205809 A1 * | 9/2005 | Uchida | 250/492.22 |
| 2007/0152169 A1 * | 7/2007 | Tamamushi et al. | 250/492.1 |
| 2009/0053395 A1 * | 2/2009 | Shemesh | 427/58 |

FOREIGN PATENT DOCUMENTS

| | | |
|---|---|---|
| JP | 3-95917 | 4/1991 |
| JP | 7-161326 | 6/1995 |
| JP | 2004-104001 | 4/2004 |

OTHER PUBLICATIONS

Office Action issued by the Korean Patent Office on Nov. 15, 2007, for Korean Patent Application No. 10-2006-0136064, and English-language translation thereof.

Notification of Reasons for Refusal issued by the Japanese Patent Office on Apr. 19, 2011, for Japanese Patent Application No. 2006-000336, and English-language translation thereof.

* cited by examiner

MOVE MECHANISM FOR MOVING TARGET OBJECT AND CHARGED PARTICLE BEAM WRITING APPARATUS

CROSS-REFERENCE TO RELATED APPLICATION

This application is based upon and claims the benefit of priority from prior Japanese Patent Application No. 2006-000336 filed on Jan. 5, 2006 in Japan, the entire contents of which are incorporated herein by reference.

BACKGROUND OF THE INVENTION

1. Field of the Invention

The present invention relates to a mechanism for moving a target object and a charged particle beam writing apparatus, and particularly to an electron beam writing apparatus which irradiates an electron beam on a target object while variable-shaping the electron beam, and a stage for use in the electron beam writing apparatus to place the target object thereon.

2. Related Art

A lithography technique which leads development of micropatterning of a semiconductor device is a very important process which uniquely generates a pattern in semiconductor manufacturing processes. In recent years, with high integration of an LSI, a circuit line width required for semiconductor devices progressively decreases year after year. In order to form a desired circuit pattern on the semiconductor devices, a high-definition original pattern (also called a reticle or a mask) is necessary. In this case, an electron beam writing technique has an essentially excellent resolution and is used in production of a high-definition original pattern.

FIG. 15 is a conceptual diagram for explaining an operation of a conventional variable-shaped electron beam writing apparatus. A variable-shaped electron beam writing apparatus (EB (Electron Beam) writing apparatus) operates as follows. In a first aperture 410, a square, for example, rectangular opening 411 to shape an electron beam 330 is formed. In a second aperture 420, a variable-shaped opening 421 to shape the electron beam 330 having passed through the opening 411 in a desired square shape is formed. The electron beam 330 irradiated from a charged particle source 430 and having passed through the opening 411 is deflected by a deflector. The electron beam 330 passes through a part of the variable-shaped opening 421 and is irradiated on a target object 340 placed on a stage. The stage continuously moves in one predetermined direction (for example, defined as an X direction). More specifically, a square shape which can pass through both the opening 411 and the variable-shaped opening 421 is written in a writing region of the target object 340. A scheme which causes an electron beam to pass through both the opening 411 and the variable-shaped opening 421 to form an arbitrary shape is called a variable shaped beam scheme.

In this case, a position of the stage on which the target object 340 is placed is measured by a laser length measuring device. When the stage position is measured by the laser length measuring device, a mirror for reflecting the laser beam is arranged in the stage. The mirror reflects a laser beam emitted from the laser length measuring device. The laser length measuring device receives the laser beam reflected from the mirror to measure the stage position from an amount of displacement.

In moving the stage in an XY-direction, a pre-load fluctuation and the like are generated in the stage including an X-stage and a Y-stage due to machining accuracy of a guideway of each stage and a change in weight balance cased by the stage movement. For this reason, an error occurs in a distance between the mirror and a work fixing jig. Therefore, there is disclosed a technique of previously measuring a relative amount of displacement between the mirror and the work fixing jig, which is generated at each point where the stage is moved (see Japanese Patent Application, Publication No. S62-217686, for example). There is disclosed a technique of decreasing a pitching error when the stage is moved in a mechanism for moving the X-stage and the Y-stage by using a cross-roller guide (see Japanese Patent Application, Publication No. 2004-104001, for example).

In the techniques disclosed in the above publications, static deformation is corrected at each position when the stage is moved. However, in the writing apparatus, a displacement different from the static displacement is also brought about by an influence of acceleration or deceleration associated with the movement of the stage. That is, when the acceleration is applied, the displacement occurs in the position measured by the laser length measuring device. This results in a problem that a target object position to be recognized is shifted due to the displacement of the position measured by the laser length measuring device.

BRIEF SUMMARY OF THE INVENTION

The present invention has as its object to provide an apparatus in which target object position shift is decreased or corrected while the acceleration is applied.

In accordance with embodiment consistent with the present invention, there is provided a move mechanism for horizontally moving a target object in an accelerating manner, including a moving unit configured to be horizontally moved in an accelerating manner, a plate-part arranged on the moving unit and supported by the moving unit at a substantially center-of-gravity height position, and a mirror part configured to reflect a laser beam for measuring a position, the mirror part being connected to the plate part such that a center-of-gravity height position of the mirror part is arranged at the substantially center-of-gravity height position of the plate part.

Also, in accordance with embodiment consistent with the present invention, there is provided a move mechanism for moving a target object including a support unit configured to support a target object, a plate part connected to a lower surface of the support unit, a mirror part configured to reflect a laser beam for measuring a position, the mirror part being connected to the plate part, and a moving unit configured to support the plate part at a lower surface of the plate part and be horizontally moved in an accelerating manner, wherein the support unit, the mirror part, and the plate part are formed such that a first value and a second value are equalized to each other, the first value being obtained by dividing a product of a height from the lower surface of the support unit to a center-of-gravity position of the target object, a mass of the target object, and acceleration in accelerating movement of the moving unit by a first elastic coefficient, and the second value being obtained by dividing a product of a height from the lower surface of the plate part to the laser beam reflection position in the mirror part, a mass of the mirror part, and acceleration in the accelerating movement of the moving unit by a second elastic coefficient.

Further, in accordance with embodiment consistent with the present invention, there is provided a move mechanism for moving a target object including a support unit configured to support a target object, a plate part connected to a lower surface of the support unit, a mirror part configured to reflect a laser beam for measuring a position, the mirror part being connected to the plate part, a moving unit configured to support the plate part at a lower surface of the plate part, and be horizontally moved in an accelerating manner, and a strain-amount measuring unit configured to measure an amount of strain of the plate part under a load received from the mirror part in accelerating movement of the moving unit.

Additionally, in accordance with embodiment consistent with the present invention, there is provided a charged particle beam writing apparatus including a stage configured to be horizontally moved in an accelerating manner while placing a target object thereon, an irradiation unit configured to irradiate a charged particle beam to the target object, and a deflector configured to deflect the charged particle beam to a position corrected based on acceleration of the stage.

DETAILED DESCRIPTION OF THE INVENTION

In the following respective embodiments, a configuration using an electron beam will be described below as an example of a charged particle beam. The charged particle beam is not limited to an electron beam. A beam such as an ion beam using other charged particles may be used.

First Embodiment

Figure 1:
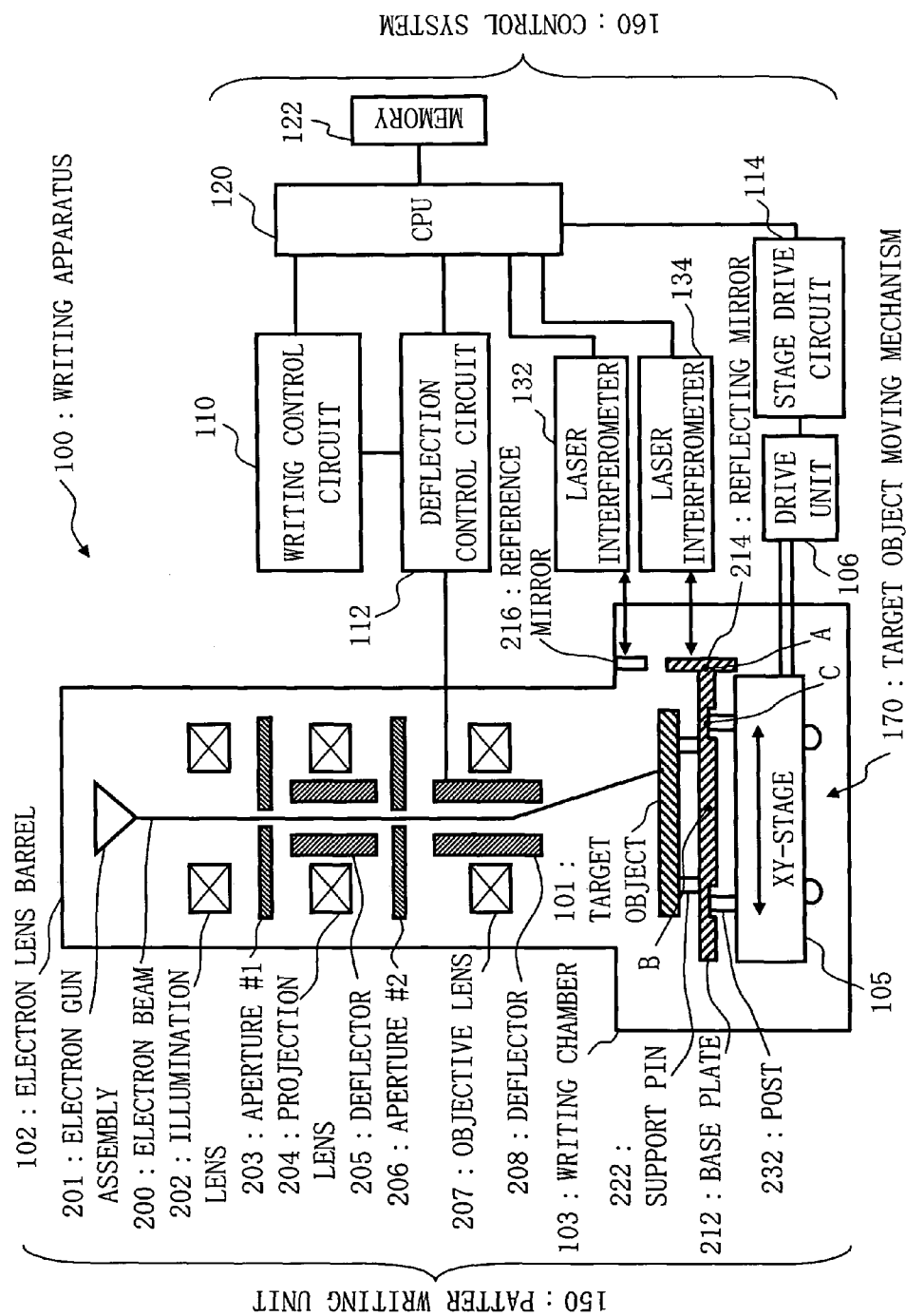
FIG. 1 is a block diagram showing a configuration of a writing apparatus according to a first embodiment of the invention.

FIG. 1 is a block diagram showing a configuration of a writing apparatus according to a first embodiment of the invention. In FIG. 1, a writing apparatus 100 includes pattern writing unit 150 serving as an example of an irradiation unit and a control unit 160. The writing apparatus 100 is an example of a charged particle beam writing apparatus. The writing apparatus 100 writes or "draws" a pattern onto a target object 101. The target object 101 includes a mask. The pattern writing unit 150 includes an electron lens barrel 102, a writing chamber 103, and a drive unit 106. The control unit 160 includes a writing control circuit 110, a deflection control circuit 112 serving as an example of a deflection control unit, a stage drive circuit 114, a CPU 120, a memory 122, a laser interferometer 132, and a laser interferometer 134. The writing control circuit 110, the deflection control circuit 112, the stage drive circuit 114, the memory 122, the laser interferometer 132, and the laser interferometer 134 are connected to the CPU 120 serving as a computer through a bus (not shown). The writing control circuit 110, the deflection control circuit 112, and the stage drive circuit 114 are controlled by a control signal output from the CPU 120. Input data or output data computed by the CPU 120 is stored in the memory 122.

An electron gun assembly 201, an illumination lens 202, a first aperture 203, a projection lens 204, a deflector 205, a second aperture 206, an objective lens 207, and a deflector 208 are arranged in the electron lens barrel 102. A target object moving mechanism 170 is arranged in the writing chamber 103. The target object moving mechanism 170 includes an XY-stage 105, a base plate 212, a reflecting mirror 214, a reference mirror 216, a support pin 222, and a post 232. The target object 101 is supported by the support pin 222. Only the components necessary to explain the first embodiment are described in FIG. 1. The writing apparatus 100 may include other components usually necessary for the writing apparatus 100.

The whole of the first aperture 203 having, for example, a rectangular hole is irradiated with an electron beam 200 emitted from the electron gun assembly 201 by the illumination lens 202. The electron beam 200 is of an example of a charged particle beam. In this case, the electron beam 200 is shaped in a rectangular shape, for example. The electron beam 200 of a first aperture image having passed through the first aperture 203 is projected onto the second aperture 206 by the projection lens 204. The position of the first aperture image on the second aperture 206 is deflected by the deflector 205 which is controlled by the writing control circuit 110, which allows a beam shape and size to be changed. The electron beam 200 of a second aperture image having passed through the second aperture 206 is focused by the objective lens 207. Then, the electron beam 200 is deflected by the deflector 208 which is controlled by the deflection control circuit 112. Thus, a desired position of the target object 101 is irradiated with the electron beam 200 on the XY-stage 105 controlled by the stage drive circuit 114. The XY-stage 105 is driven by the drive unit 106. That is, the XY-stage 105 is movably arranged.

Figure 2:
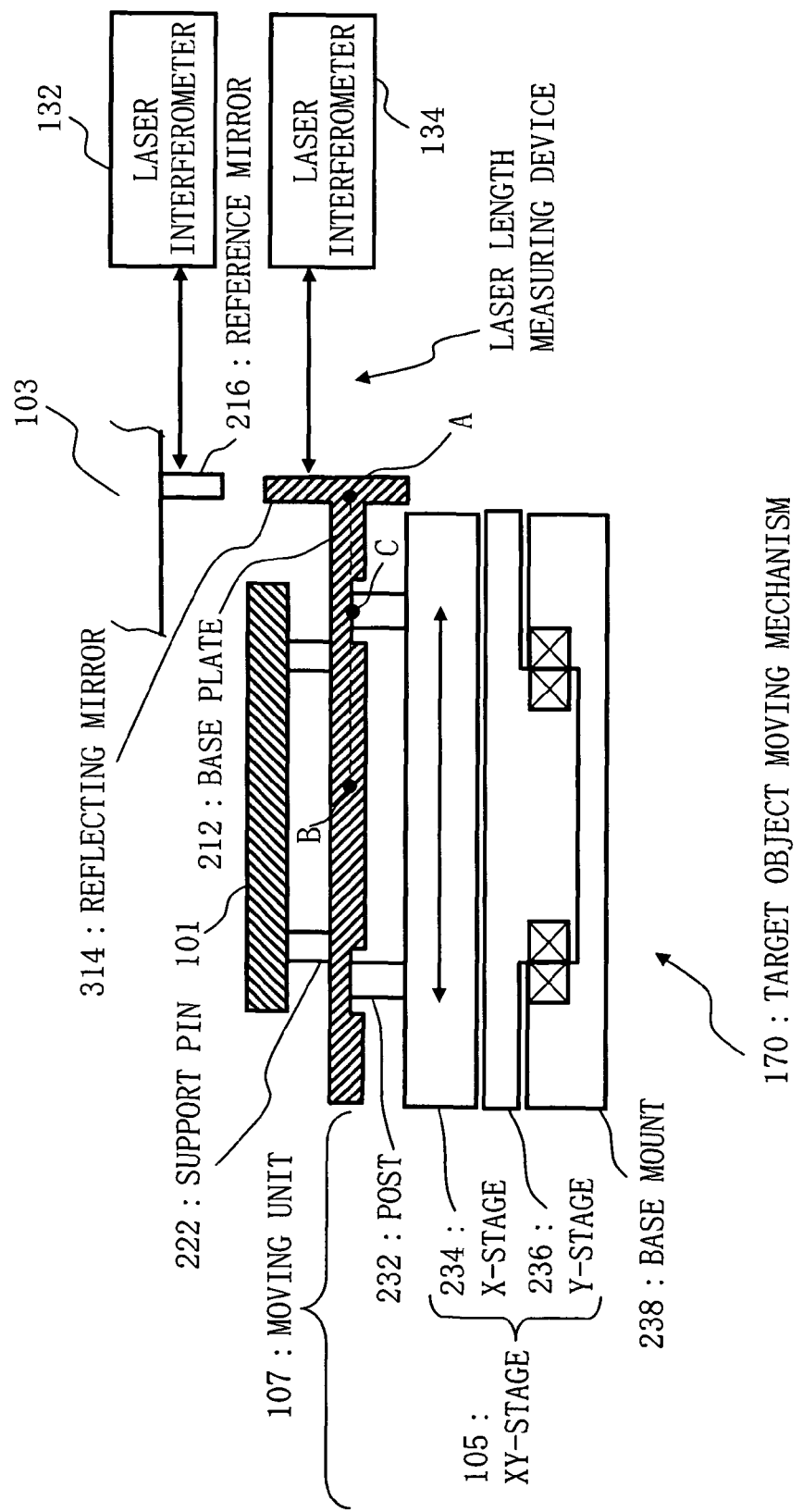
FIG. 2 is a schematic diagram showing a configuration of a target object moving mechanism provided in a writing chamber of the first embodiment.

FIG. 2 schematically shows a configuration of the target object moving mechanism provided in the writing chamber of the first embodiment. In the target object moving mechanism 170, the XY-stage 105 is arranged on a base mount 238. The XY-stage 105 includes an X-stage 234 and a Y-stage 236. The Y-stage 236 connected onto the base mount 238 by a slide mechanism such as a cross roller is arranged so as to be movable in the Y-direction. As with the Y-stage 236, the X-stage 234 connected onto the Y-stage 236 by a slide mechanism such as a cross roller is arranged so as to be movable in the X-direction. The plural posts 232 are arranged on the X-stage 234, and a base plate 212 serving as an example of a plate part is connected to the plural posts 232. The XY-stage 105 and the posts 232 are moved as the moving unit 107, which allows the base plate 212 to be moved in the XY-direction which is the horizontal direction. Preferably, the base plate 212 is supported and fixed by the three posts 232 to retain a parallelism of the base plate 212 with higher accuracy.

A reflecting mirror 214 is integrally formed in an outer peripheral portion of the base plate 212. The reflecting mirror 214 reflects a length measuring laser beam emitted from the laser interferometer 134. The reflecting mirror 214 is formed in a shape projected from both the surface and the backside of the base plate 212. The plural support pins 222 are connected to the base plate 212, and the target object 101 is placed on the plural support pins 222. Preferably, the target object 101 is supported by the three support pins 222 to retain the parallelism of the target object 101 with higher accuracy.

Preferably, a height position of the laser beam emitted from the laser interferometer 134 to the reflecting mirror 214 is matched with a height position of the surface of the target object 101. This configuration is preferable because the Abbe's error is not generated in measuring the length with the laser beam.

Openings are made in the backside of the base plate 212. The posts 232 are connected to the openings to be fixed to the base plate 212, respectively. The opening is made to a center-of-gravity height position B of the base plate 212. That is, the post 232 is supported by and fixed to the center-of-gravity height position B of the base plate 212.

The reflecting mirror 214 integrally formed in the base plate 212 is formed in symmetric relation to the center-of-gravity height position B of the base plate 212. In other words, the reflecting mirror 214 is formed in a hammerhead shape. This enables a center-of-gravity height position A of the reflecting mirror 214 to be matched with the center-of-gravity height position B of the base plate 212. Thus, the center-of-gravity height position A of the reflecting mirror 214 is formed to be matched with a connection position C between the post 232 and the center-of-gravity height position B of the base plate 212.

In the writing apparatus 100, a desired pattern is sequentially written on the target object 101 while the XY-stage 105 is continuously moved, and the XY-stage 105 is moved at variable speed according to density of the pattern. A pattern writing time can be shortened by moving the XY-stage 105 at variable speed. The laser beam emitted from the laser interferometer 134 is reflected by the reflecting mirror 214, and the reflected light is received by the laser interferometer 134 to measure the position of the reflecting mirror 214. On the other hand, the laser beam emitted from the laser interferometer 132 is reflected by the reference mirror 216 which is of a reference fixed to the writing chamber 103, and the reflected light is received by the laser interferometer 132 to measure the position of the reference mirror 216. The position of the target object 101 can be measured from a relative distance between both the measured positions.

Figure 3:
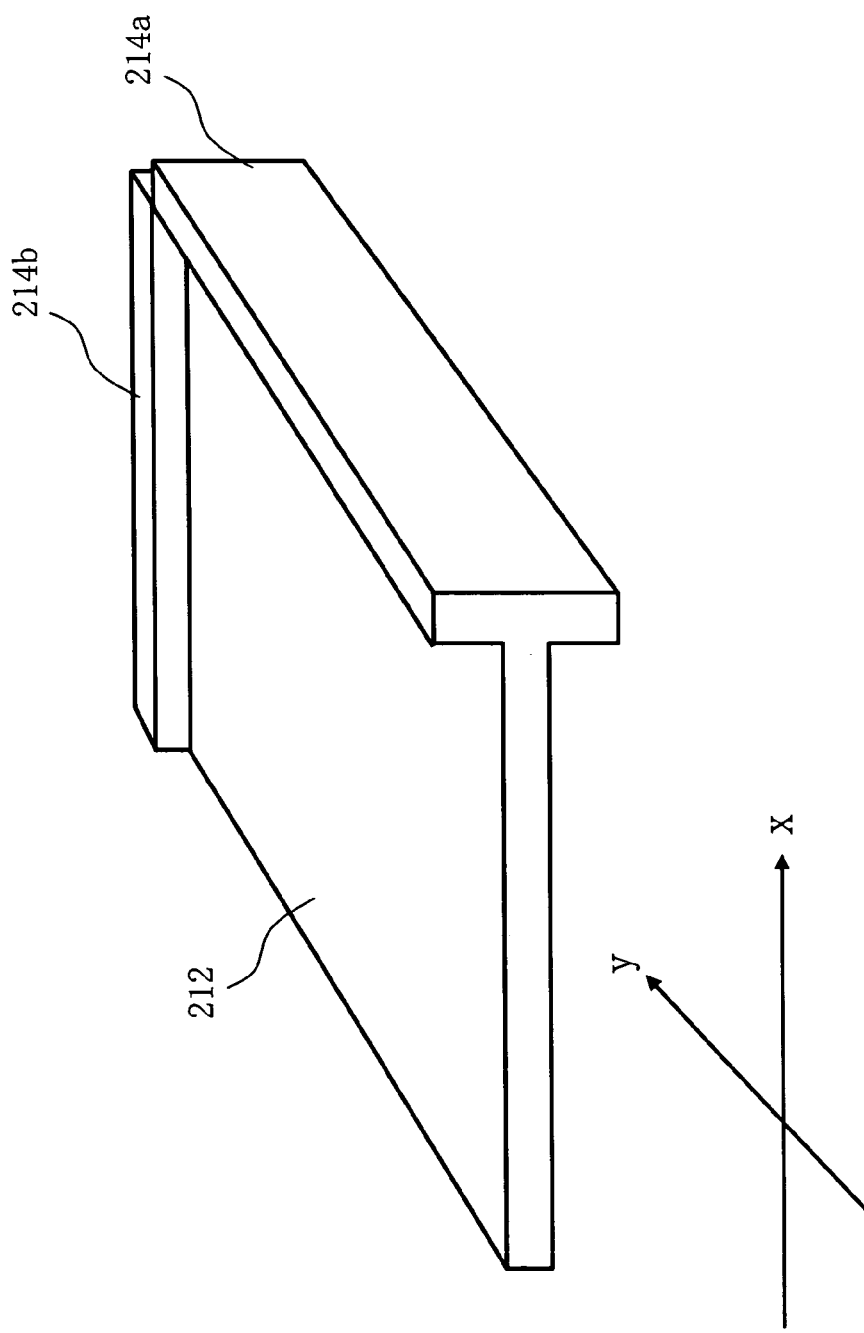
FIG. 3 is a schematic view showing a base plate and a reflecting mirror of the first embodiment.

FIG. 3 schematically g shows the base plate and the reflecting mirror of the first embodiment. In FIG. 3, a reflecting mirror 214a and a reflecting mirror 214b are formed at two end portions orthogonal to each other of four end portions of the base plate 212. The movement of the XY-stage 105 in the X-direction is measured by the reflecting mirror 214a, and the movement in the Y-direction is measured by the reflecting mirror 214b. In the first embodiment, the reflecting mirror 214a and the reflecting mirror 214b are integrally formed in the base plate 212. However, the reflecting mirror 214a and the reflecting mirror 214b may separately be formed from the base plate 212. For example, the reflecting mirror 214a and the reflecting mirror 214b are fixed to the base plate 212 with screws or the like. In the first embodiment, it is necessary that the center-of-gravity height positions of the reflecting mirror 214a and the reflecting mirror 214b are formed so as to be matched with the center-of-gravity height position of the base plate 212.

Figure 4:
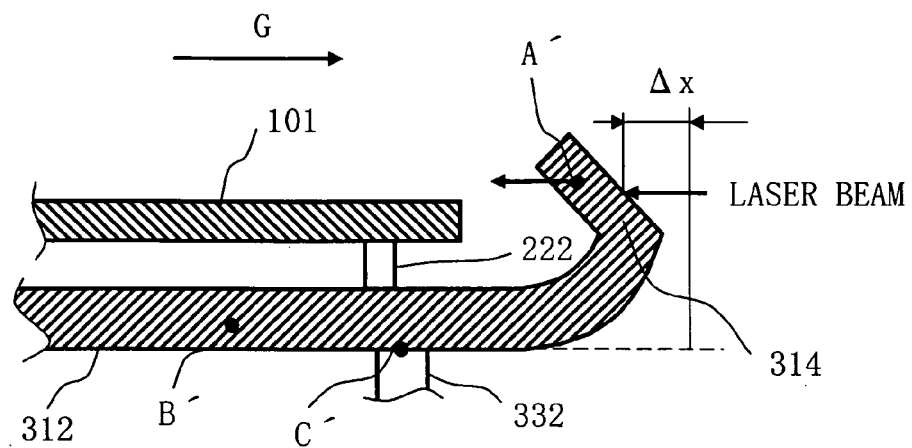
FIG. 4 is a schematic diagram showing a part of the target object moving mechanism when center-of-gravity positions are shifted.

FIG. 4 schematically shows a part of the target object moving mechanism when the center-of-gravity positions are shifted. The XY-stage 105 and components below the XY-stage 105 are neglected in FIG. 4. Plural posts 332 are arranged on the X-stage 234, and a base plate 312 is connected to the plural posts 332. The XY-stage 105 and the post 332 are moved as the moving unit 107, which allows the base plate 312 to be moved in the XY-direction which is the horizontal direction.

A reflecting mirror 314 is integrally formed in the outer peripheral portion of the base plate 312. The reflecting mirror 314 reflects the length measuring laser beam emitted from the laser interferometer. The plural support pins 222 are connected to the base plate 312, and the target object 101 is placed on the plural support pins 222. The height position of the laser beam emitted from the laser interferometer to the reflecting mirror 314 is matched with the height position of the surface of the target object 101.

In FIG. 4, an opening is not formed in the backside of the base plate 312, but the post 332 is connected to the height position of the backside of the base plate 312 and fixed to the base plate 312. That is, the post 332 is supported by and fixed to the height position which is not the center-of-gravity height position of the base plate 312. The reflecting mirror 314 integrally formed in the base plate 312 is not formed in symmetric relation to the center-of-gravity height B of the base plate 312, but is formed in the shape projected from the base plate 312. In FIG. 4, a center-of-gravity height position A' of the reflecting mirror 314 is formed to be different from a connection position C' between the post 332 and a center-of-gravity height B' of the base plate 312.

When the target object moving mechanism shown in FIG. 4 is horizontally moved with acceleration G, the reflecting mirror 314 is particularly deformed toward the side of the target object 101 by the acceleration G, which shifts the laser beam irradiation position by Δx. The amount of displacement of the reflecting mirror 314 is larger than that of the target object 101. Therefore, an error occurs in a relative distance between the target object 101 and the reflecting mirror 314, and the positions are measured while the error left. As a result, the position of the target object 101 recognized by the CPU 120 is shifted, which hardly writes a pattern at a desired position.

Figure 5:
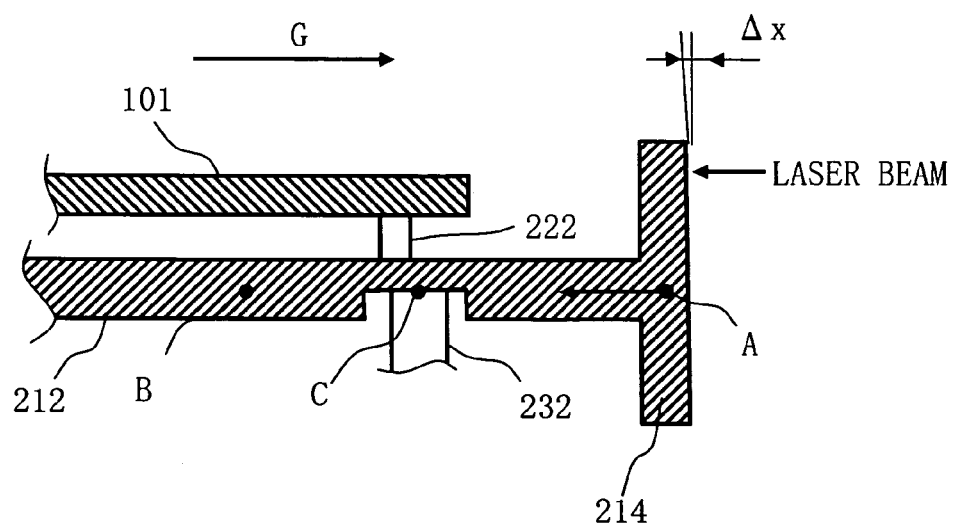
FIG. 5 is a schematic diagram showing a part of the target object moving mechanism of the first embodiment when the center-of-gravity positions are matched.

On the contrary, FIG. 5 schematically shows apart of the target object moving mechanism of the first embodiment when center-of-gravity positions are matched. As with the case shown in FIG. 4, the XY-stage 105 and components below the XY-stage 105 are neglected in FIG. 5. As described above, in the first embodiment, the center-of-gravity height position A of the reflecting mirror 214 is formed to be matched with the connection position C between the post 232 and the center-of-gravity height position B of the base plate 212. Even if the target object moving mechanism shown in FIG. 5 is horizontally moved with the acceleration G, moment is not applied to the reflecting mirror 214. This is because the connection position C which becomes a power point is equal to the height position of the center-of-gravity height position A of the reflecting mirror 214. As a result, the amount of displacement Δx can be eliminated or decreased at the laser beam irradiation position of the reflecting mirror 214. At the same time, because the connection position C which becomes the power point is equal to the height position of the center-of-gravity height position B of the base plate 212, the moment is not applied to the base plate 212, and the amount of displacement of the base plate 212 itself can be eliminated or decreased. Because the deformations of the reflecting mirror 214 and base plate 212 are suppressed to the minimum, the relative distance between the target object 101 and the reflecting mirror 214 is not changed or suppressed to a small amount. Accordingly, the positions are accurately detected even in the moving state in which the acceleration G is applied, so that a pattern can be written at a desired position.

The center-of-gravity height positions of the base plate 212 and reflecting mirror 214 are arranged to be equal to the connection position C (power point) between the base plate 212 and the post 232 serving as the moving unit 107. Therefore, the moment applied to the base plate 212 and the moment applied to the reflecting mirror 214 are eliminated or decreased, so that the deformations of the base plate 212 and reflecting mirror 214 can be prevented. Accordingly, the target object position can be measured with high accuracy, the target object position shift can be decreased, and a pattern can be written at a desired position.

Second Embodiment

Figure 6:
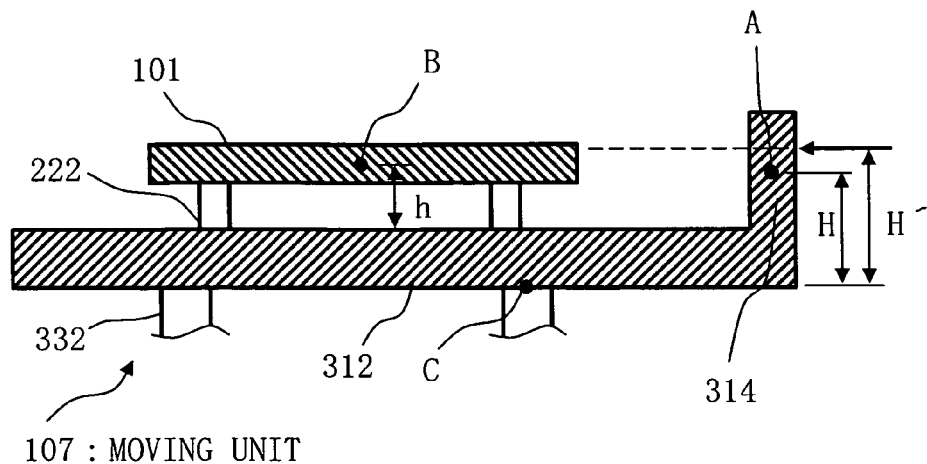
FIG. 6 is a schematic diagram showing a part of a target object moving mechanism according to a second embodiment of the invention.

FIG. 6 schematically shows a part of a target object moving mechanism according to a second embodiment of the invention. In the second embodiment, the configurations and operations are similar to those of the first embodiment except for the writing apparatus 100 shown in FIG. 6. In FIG. 6, as with the first embodiment, the reflecting mirror 314 is integrally formed in one end of the base plate 312, and the reflecting mirror 314a and the reflecting mirror 314b are formed. That is, although not shown in the drawing, the reflecting mirror 314a which measures the movement in the X-direction and the reflecting mirror 314b which measures the movement in the Y-direction are formed in the two end portions orthogonal to each other of the four end portions of the base plate 312. The reflecting mirror 314a and the reflecting mirror 314b are integrally formed in the base plate 312. However, the reflecting mirror 214a and the reflecting mirror 214b may separately be formed from the base plate 312. For example, the reflecting mirror 214a and the reflecting mirror 214b are fixed to the base plate 312 with screws or the like.

In the target object moving mechanism 170 of the second embodiment, as with the first embodiment, the target object 101 is supported by the support pins 222 serving as an example of a support unit. As with the first embodiment, the base plate 312 serving as an example of a plate part is connected to the support pin 222 at the lower surface of the support pin 222. As with the first embodiment, the reflecting mirror 314 serving as an example of a mirror part is connected to the base plate 312 to reflect the length measuring laser beam. The XY-stage 105 and the posts 332 are moved as the moving unit 107. The base plate 312 is supported at the lower surface of the base plate 312 by the posts 332 serving as a part of the moving unit 107, and the posts 332 are horizontally moved in an accelerating manner.

As shown in FIG. 6, in the second embodiment, the reflecting mirror 314 is not formed in symmetric relation to the center-of-gravity height of the base plate 312. The reflecting mirror 314 is formed in the end portion of the base plate 312 so as to be extended only toward the side of the target object 101, on which the laser beam reflection position is located. The opening made to the center-of-gravity height of the base plate 312 is not formed in the backside of the base plate 312, but the post 332 is connected to the lower surface of the base plate 312. In FIG. 6, the letter A designates a center-of-gravity position of the reflecting mirror 314, and the letter B designates a center-of-gravity position of the target object 101. The letter C designates a position which becomes a power point applied to the base plate 312 from the post 332 serving as a part of the moving unit 107, and the letter h designates a height from the lower surface of the support pin 222 to the center-of-gravity position B of the target object 101. In addition, the letter H designates a height from the lower surface of the base plate 312 to the center-of-gravity position A of the reflecting mirror 314, and the letter H' designates a height from the lower surface of the base plate 312 to the laser beam reflection position in the reflecting mirror 314.

In the second embodiment, the support pin 222, the reflecting mirror 314, and the base plate 312 are formed such that a value $\Delta x_1$, (first value) is equalized to a value $\Delta x_2$ (second value). The value $\Delta x_1$ is obtained by dividing a product of the height h from the lower surface of the support pin 222 to the center-of-gravity position B of the target object 101, a mass m of the target object 101, and acceleration G in the accelerating movement of the moving unit 107 by an elastic coefficient $E_A$ (first elastic coefficient) of the support pin 222. The value $\Delta x_2$ is obtained by dividing a product of the height H' from the lower surface of the base plate 312 to the laser beam reflection position in the reflecting mirror 314, a mass M of the reflecting mirror 314, and acceleration G in the accelerating movement of the moving unit 107 by an elastic coefficient $E_B$ (second elastic coefficient) of the base plate 312.

Figure 7:
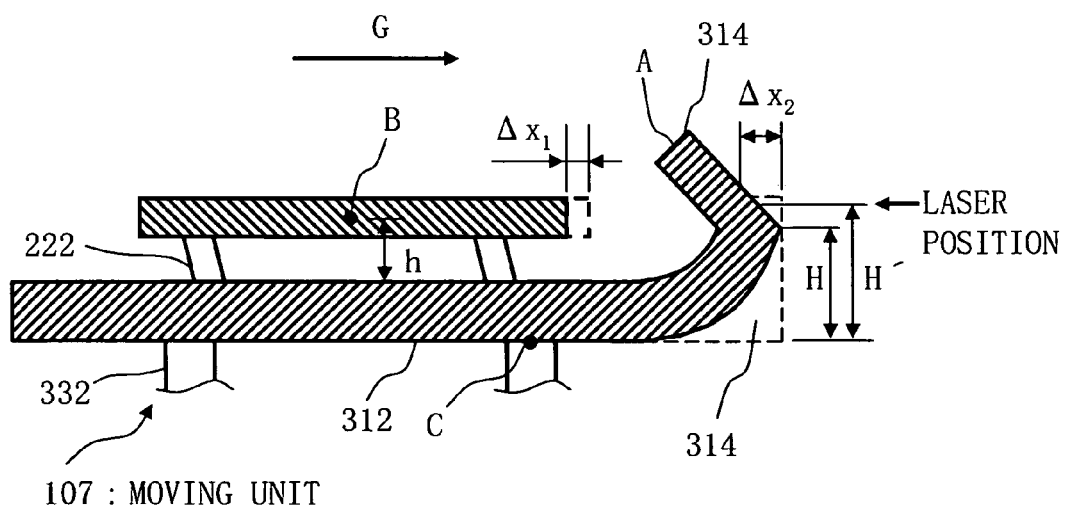
FIG. 7 is a schematic diagram for explaining a state in which acceleration is applied to the target object moving mechanism of the second embodiment.

FIG. 7 is a schematic diagram for explaining a state in which acceleration is applied to the target object moving mechanism of the second embodiment. When the moving unit 107 is horizontally moved with the acceleration G, the elastic deformation is generated in the support pin 222 by the mass m of the target object 101, which displaces the support pin 222 toward the opposite direction to the accelerating direction. Similarly, the elastic deformation is generated in the base plate 312 by the mass M of the reflecting mirror 314, which displaces the base plate 312 toward the opposite direction to the accelerating direction at the laser beam reflection position in the reflecting mirror 314.

Assuming that $\Delta x_1$ is the amount of displacement of the target object 101 and $\Delta x_2$ is the amount of displacement of the laser beam reflection position in the reflecting mirror 314, relationships of $\Delta x_1 = m \cdot G \cdot h / E_A$ and $\Delta x_2 = M \cdot G \cdot H / E_B \cdot (H'/H)$ are obtained. When the shapes, materials and the like are selected so as to be $\Delta x_1 = \Delta x_2$, the relative positional relationship can be maintained even if the displacement occurs between the target object 101 and the reflecting mirror 314 by the acceleration. Accordingly, the error is canceled to grasp the position with high accuracy, and the position shift can be decreased in the target object 101 recognized in the writing apparatus 100.

Third Embodiment

Figure 8:
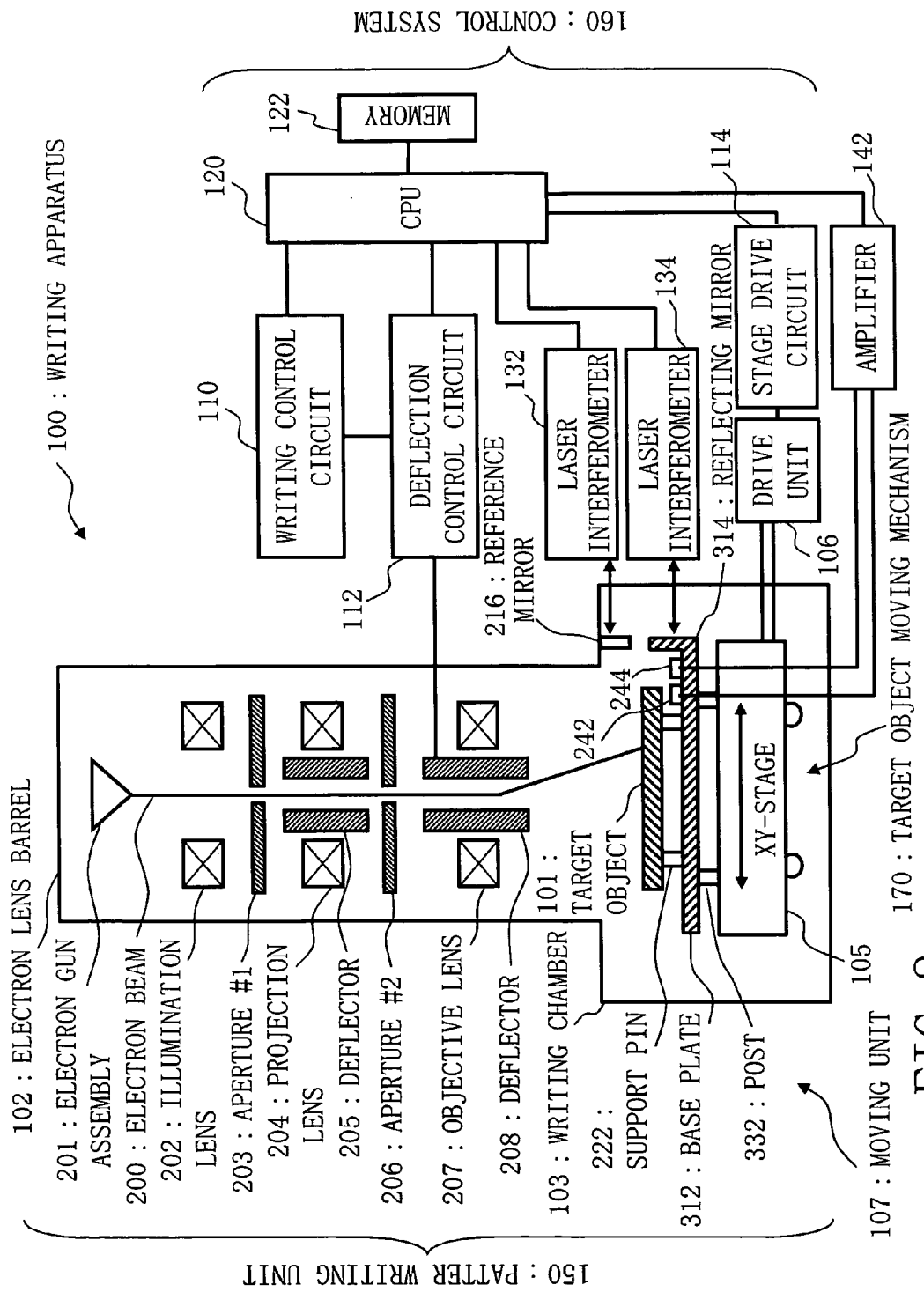
FIG. 8 is a block diagram showing a configuration of a writing apparatus according to a third embodiment of the invention.

FIG. 8 is a block diagram showing a configuration of a writing apparatus according to a third embodiment of the invention. In FIG. 8, the same target object moving mechanism 170 as that of the second embodiment is used in the pattern writing unit 150 serving as an example of an irradiation unit. The target object moving mechanism 170 includes the XY-stage 105, the base plate 312, the reflecting mirror 314, the reference mirror 216, the support pin 222, and the post 332. The target object moving mechanism 170 further includes a strain gage 242 and a strain gage 244 each serving as an example of a strain-amount measuring unit. The control unit 160 includes an amplifier 142. Other configurations of the third embodiment are similar to those of the first embodiment. Only the components necessary to explain the third embodiment are described in FIG. 8. The writing apparatus 100 may include other components.

In FIG. 8, the configurations and operations of the writing apparatus 100 of the third embodiment are the same as those of the writing apparatus 100 of the second embodiment except that the strain gage 242 and the strain gage 244 are attached to the base plate 312, the strain gage 242 and the strain gage 244 are connected to the strain gage amplifier 142, and the amplifier 142 is connected to the CPU 120. That is, in the third embodiment, the reflecting mirror 314 is not formed in symmetrical relation to the base plate 312. The reflecting mirror 314 is formed in the end portion of the base plate 312 so as to be extended only toward the side of the target object 101, on which the laser beam reflection position is located. The opening made to the center-of-gravity height of the base plate 312 is not formed in the backside of the base plate 312, but the post 332 is connected to the lower surface of the base plate 312. Although the configuration of the third embodiment is similar to that of the second embodiment, unlike the configuration of the second embodiment, it is not necessary in the third embodiment that the shapes, materials and the like are selected so as to be $\Delta x_1 = \Delta x_2$ for the amount of displacement $\Delta x_1$ of the target object 101 and the amount of displacement $\Delta x_2$ of the laser beam reflection position in the reflecting mirror 314.

In FIG. 8, as with the first and second embodiments, the reflecting mirror 314 is integrally formed in one end of the base plate 312, and the reflecting mirror 314a and the reflecting mirror 314b are formed. This is, although not shown in the drawing, the reflecting mirror 314a which measures the movement in the X-direction and the reflecting mirror 314b which measures the movement in the Y-direction are formed in the two end portions orthogonal to each other of the four end portions of the base plate 312. The reflecting mirror 314a and the reflecting mirror 314b are integrally formed in the base plate 312. However, the reflecting mirror 314a and the reflecting mirror 314b may separately be formed from the base plate 312. For example, the reflecting mirror 314a and the reflecting mirror 314b are fixed to the base plate 312 with screws or the like. A strain gage 242a and a strain gage 244a (not shown), which measure strains in the X-direction, are attached to the base plate 312. The strain gage 242a and the strain gage 244a are connected to a strain gage amplifier 142a, and the amplifier 142a is connected to the CPU 120. Similarly, a strain gage 242b and a strain gage 244b (not shown), which measure strains in the Y-direction, are attached to the base plate 312. The strain gage 242b and the strain gage 244b are connected to a strain gage amplifier 142b, and the amplifier 142b is connected to the CPU 120.

Figure 9:
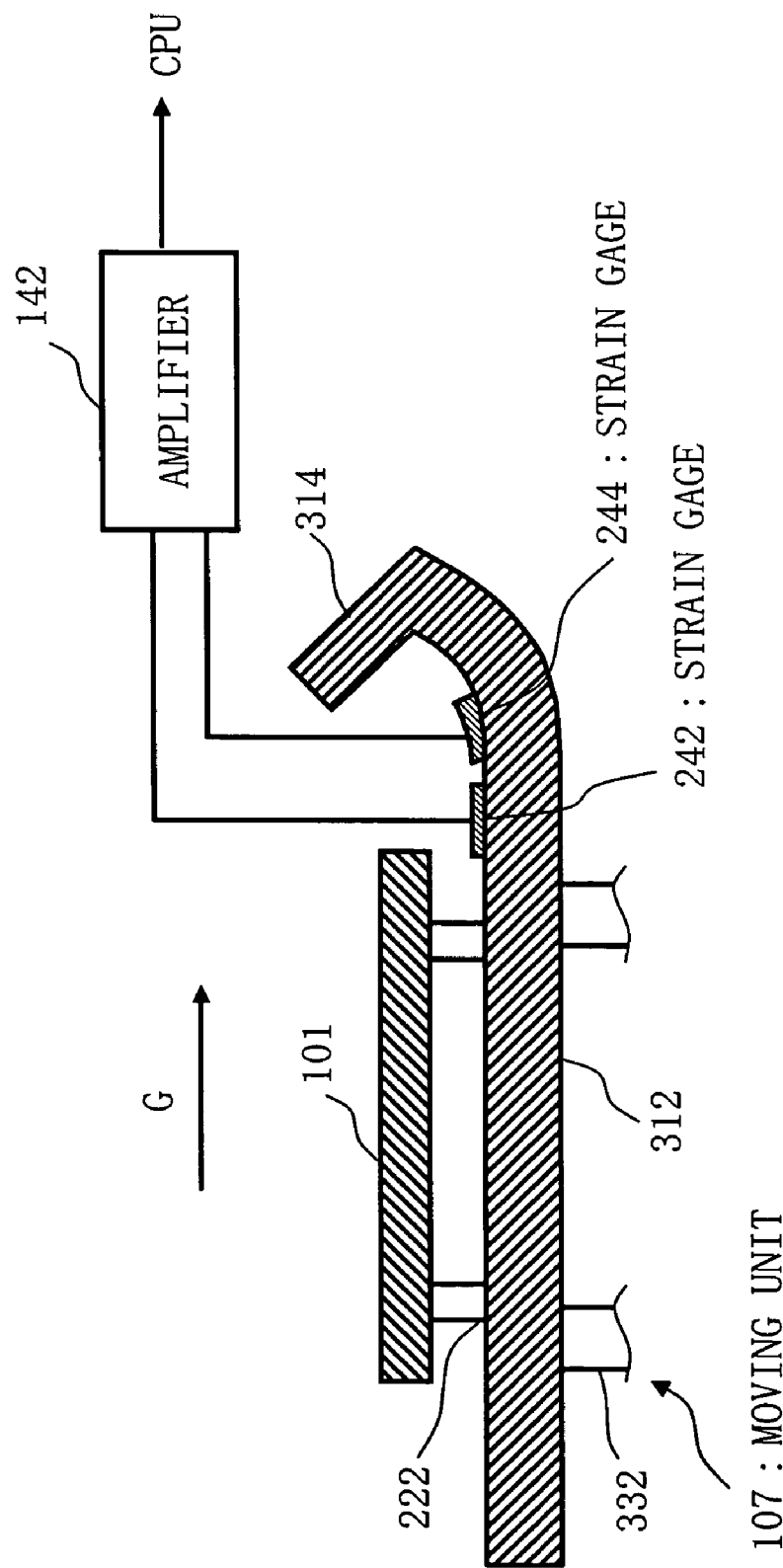
FIG. 9 is a schematic diagram for explaining a state in which acceleration is applied to the target object moving mechanism of the third embodiment.

FIG. 9 is a schematic diagram for explaining a state in which acceleration is applied to the target object moving mechanism of the third embodiment. In FIG. 8, the XY-stage 105 and the posts 332 are moved as the moving unit 107. When the moving unit 107 is horizontally moved with the acceleration G, the elastic deformation is generated in the base plate 312 by the mass M of the reflecting mirror 314, which displaces the reflecting mirror 314 toward the opposite direction to the accelerating direction. The strain gage 242 which is of a reference is provided at the position where the deformation is not generated (position which is not strained) in the base plate 312. The strain gage 244 is provided at the position where the deformation is generated (position which is strained). Therefore, the amount of strain of the base plate 312 can be measured from the relative amount of strain under a load received from the reflecting mirror 314 to which the acceleration G is applied. Preferably, the strain gage 242 and the strain gage 244 are provided in the upper surface of the base plate 312. Alternatively, the strain gage 242 and the strain gage 244 may be provided in the lower surface of the base plate 312. The strain gage 242 and the strain gage 244 may be provided in any position as long as the amount of strain of the base plate 312 caused by the acceleration G can be measured from the reflecting mirror 314.

As described above, when the target object moving mechanism 170 is horizontally moved with the acceleration G, the reflecting mirror 314 is particularly deformed toward the side of the target object 101 by the acceleration G, which shifts the laser beam irradiation position by $\Delta x$. The amount of displacement of the reflecting mirror 314 is larger than that of the target object 101. For this reason, an error occurs in the relative distance between the target object 101 and the reflecting mirror 314, and the position which is measured with the laser beam and recognized by the CPU 120 is shifted in the target object 101. Therefore, a pattern cannot be written at a desired position. In the third embodiment, the CPU 120 computes the amount of displacement of the reflecting mirror 314 from the amount of strain of the base plate 312 input from the amplifier 142. Accordingly, the relative distance between target object 101 and the reflecting mirror 314 can be corrected, and the error can be corrected to grasp the position with high accuracy. As a consequence, the position shift can be decreased in the target object 101 recognized in the writing apparatus 100.

Fourth Embodiment

Figure 10:
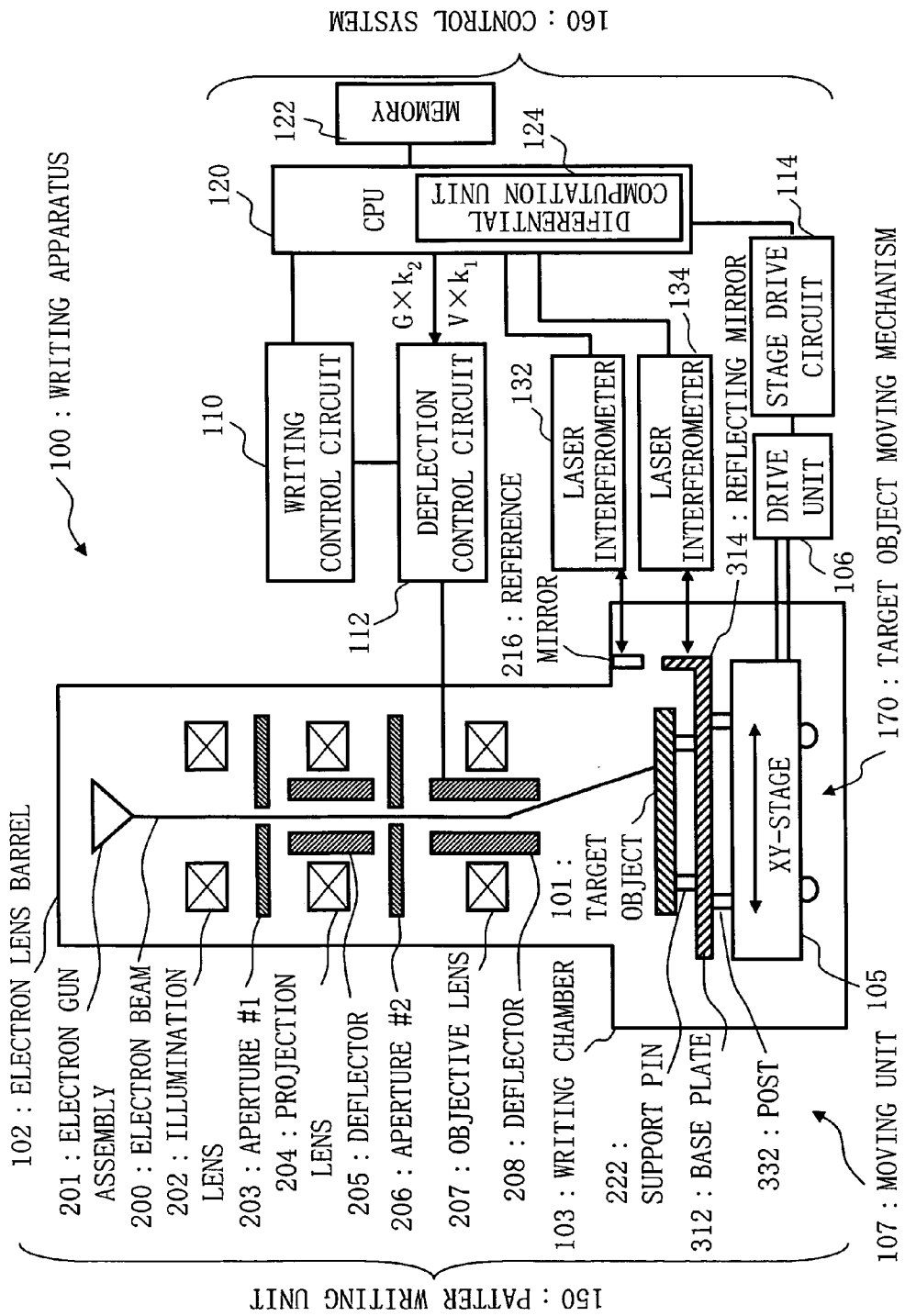
FIG. 10 is a block diagram showing a configuration of a writing apparatus according to a fourth embodiment of the invention.

FIG. 10 is a block diagram showing a configuration of a writing apparatus according to a fourth embodiment of the invention. In FIG. 10, the same target object moving mechanism 170 as that of the second embodiment is used in the pattern writing unit 150 serving as an example of an irradiation unit. The target object moving mechanism 170 includes the XY-stage 105, the base plate 312, the reflecting mirror 314, the reference mirror 216, the support pin 222, and the post 332. The CPU 120 includes a function such as a differential computation unit 124. Other configurations of the fourth embodiment are similar to those of the first embodiment. Only the components necessary to explain the fourth embodiment are described in FIG. 10. The writing apparatus 100 may include other components.

The function of the differential computation unit 124 is performed by the CPU 120 serving as a computer (computation device) in FIG. 10. Alternatively, the function of the differential computation unit 124 may be realized by a combination of hardware formed by an electric circuit and software, or may be realized by a combination of the hardware and firmware.

The configurations and operations of the writing apparatus 100 of the fourth embodiment shown in FIG. 10 are the same as those of the writing apparatus 100 of the second embodiment except that the CPU 120 includes the differential computation unit 124. That is, in the fourth embodiment, the reflecting mirror 314 is not formed in symmetrical relation to the base plate 312. The reflecting mirror 314 is formed in the end portion of the base plate 312 so as to be extended only toward the side of the target object 101, on which the laser beam reflection position is located. The opening made to the center-of-gravity height of the base plate 312 is not formed in the backside of the base plate 312, but the post 332 is connected to the lower surface of the base plate 312. Although the configuration of the fourth embodiment is similar to that of the second embodiment, unlike the configuration of the second embodiment, it is not necessary in the fourth embodiment that the shapes, materials and the like are selected so as to be $\Delta x_1 = \Delta x_2$ for the amount of displacement $\Delta x$, of the target object 101 and the amount of displacement $\Delta x_2$ of the laser beam reflection position in the reflecting mirror 314.

Figure 11:
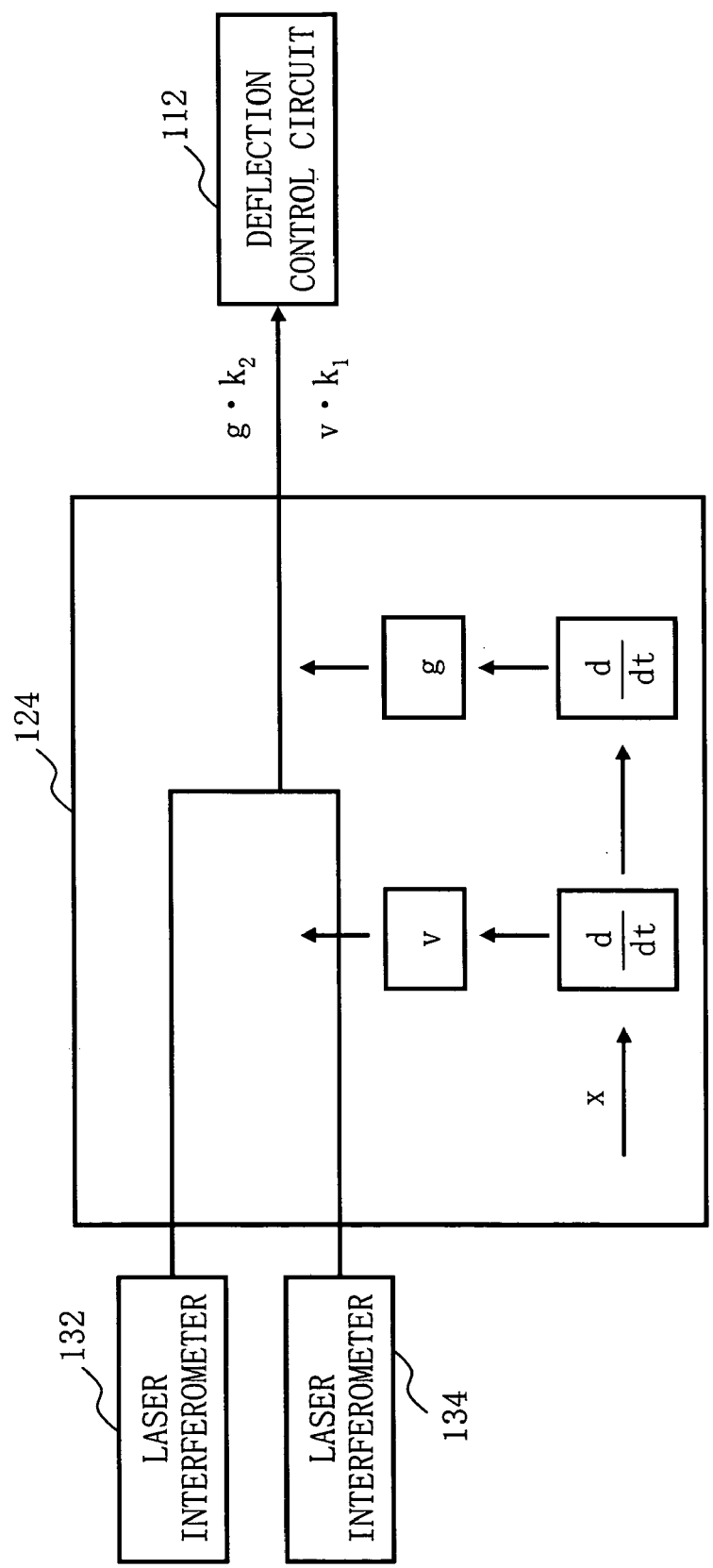
FIG. 11 is a schematic diagram showing processing contents performed by a differential computation unit of the fourth embodiment.

FIG. 11 is a schematic diagram for explaining processing contents performed by the differential computation unit of the fourth embodiment. In FIG. 10, the XY-stage 105 and the posts 332 are moved as the moving unit 107. As described above, when the moving unit 107 is horizontally moved with the acceleration G, the elastic deformation is generated in the reflecting mirror 314 by the acceleration G, which shifts the laser beam irradiation position by $\Delta x$. The amount of displacement of the reflecting mirror 314 is larger than that of the target object 101. For this reason, an error occurs in the relative distance between the target object 101 and the reflecting mirror 314, and the position which is measured with the laser beam and recognized by the CPU 120 is shifted in the target object 101. Therefore, a pattern cannot be written at a desired position. In the fourth embodiment, the differential computation unit 124 of the CPU 120 differentiates an amount of displacement X at the position of the reflecting mirror 314, which becomes the stage position inputted from the laser interferometer 132 and laser interferometer 134, with respect to time t. In this manner, velocity v of the target object moving mechanism is measured, and the position to which the deflector 208 should deflect the electron beam 200 is corrected based on a product of a predetermined coefficient $k_1$ and the velocity v.

In the fourth embodiment, the differential computation unit 124 differentiates the velocity v with respect to the time t, which allows the acceleration g to be measured in the target object moving mechanism 170. In other words, the differential computation unit 124 computes the acceleration g from the amount of displacement of the stage position measured by the laser length measuring device. The deflection control circuit 112 performs the control based on the acceleration g computed by the differential computation unit 124 such that the position to which the deflector 208 deflects the electron beam 200 is matched with the position corrected based on the acceleration g. The deflector 208 deflects the electron beam 200 using the signal from the deflection control circuit 112 based on the acceleration computed by the differential computation unit 124.

Specifically, when the differential computation unit 124 computes the acceleration g, the CPU 120 outputs a signal corrected based on a product of a predetermined coefficient $k_2$ and the acceleration g to the deflection control circuit 112. The deflection control circuit 112 outputs a deflection signal is response to the signal, and the position to which the deflector 208 deflects the electron beam 200 is controlled by applying a deflection voltage to the deflector 208 from a deflection amplifier (not shown). The deflector 208 deflects the electron beam 200, which allows the pattern to be written at the desired position in the writing apparatus 100.

Thus, the acceleration g is computed from the amount of displacement X of the stage position, which allows the position data to be corrected in consideration of the stage position error caused by the acceleration g. That is, because the correction is performed in the relative distance between the target object 101 and the reflecting mirror 314, the error can be corrected to grasp the position with high accuracy. Consequently, the amount of deflection with which the electron beam 200 is deflected can be corrected, the target object 101 is correctly irradiated with the electron beam 200, and the positions if t can be decreased in the target object 101 recognized in the writing apparatus 100.

Fifth Embodiment

Figure 12:
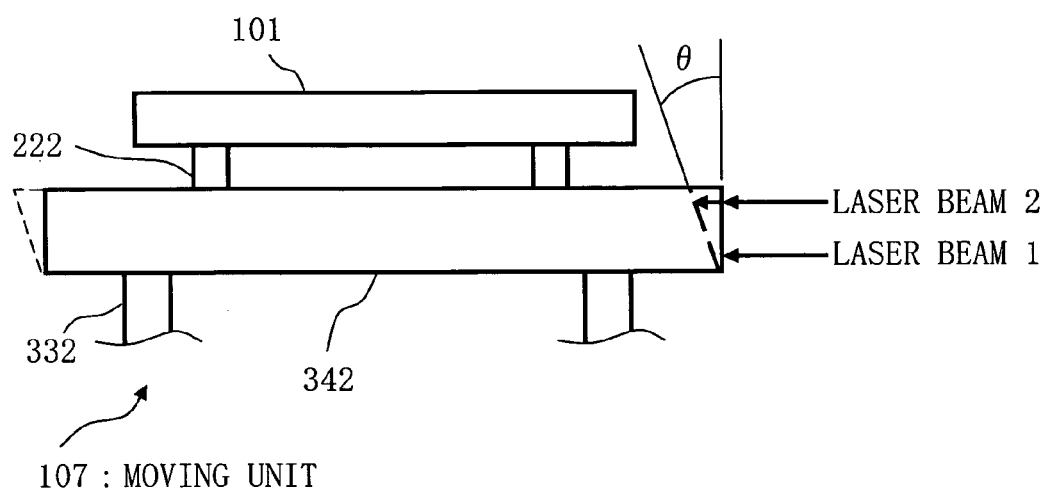
FIG. 12 is a schematic diagram showing a part of a target object moving mechanism according to a fifth embodiment of the invention.

FIG. 12 is a schematic diagram showing a part of a target object moving mechanism according to a fifth embodiment of the invention. The configurations and operations of the writing apparatus 100 of the fifth embodiment are the same as those of the writing apparatus 100 of the first embodiment except that the configuration shown in FIG. 12. In the fifth embodiment, a side face of the base plate 342 is formed as a reflecting mirror. Although not shown in the drawing, one of the two side faces orthogonal to each other in four side faces of the base plate 342 is also used as the reflecting mirror which measures the movement in the X-direction, and the other side face is also used as the reflecting mirror which measures the movement in the Y-direction. In the fifth embodiment, the two positions whose heights are different from each other are irradiated with the laser beams in the side face of the base plate 342. In the first embodiment of FIG. 1, except for the reference mirror laser interferometer, the writing apparatus 100 includes only one laser interferometer (one laser interferometer in each of the X and Y-directions). The reflecting mirror is irradiated with the laser interferometer and the laser beam is received from the reflecting mirror, whereby the reflection position is measured in the side face of the base plate 342. On the other hand, in the fifth embodiment, the writing apparatus 100 includes two laser interferometers (two laser interferometers in each of the X and Y-directions). The two positions whose heights are different from each other are irradiated with the laser beams emitted from the two laser interferometers and the laser beams are received, whereby the reflection positions are measured in the side face the base plate 342. Thus, the writing apparatus 100 of the fifth embodiment includes the two laser interferometers. That is, the writing apparatus 100 includes the two laser interferometers in each of the X and Y-directions except for the reference mirror laser interferometer.

In the target object moving mechanism 170 of the fifth embodiment, as with the first embodiment, the support pin 222 serving as an example of a support unit supports the target object 101, and the base plate 342 serving as an example of a plate part is connected to the lower surface of the support pin 222. The XY-stage 105 and the post 332 are moved as the moving unit 107. The posts 332 serving as a part of the moving unit 107 support the base plate 342 at the lower surface of the base plate 342, and the posts 332 are horizontally moved in the accelerating manner.

As described above, when the moving unit 107 is horizontally moved with the acceleration G, the elastic deformation is generated in the base plate 342 which is also used as the reflecting mirror by the acceleration G, which shifts the laser beam irradiation position by $\Delta x$. The amount of displacement of the base plate 342 which is also used as the reflecting mirror is larger than that of the target object 101. For this reason, an error occurs in the relative distance between the target object 101 and the laser beam irradiation position, and the position which is measured with the laser beam and recognized by the CPU 120 is shifted in the target object 101. Therefore, a pattern cannot be written at a desired position. In the fifth embodiment, a deformation angle θ of the side face can be computed by measuring the two positions whose heights are different from each other, and the position of the target object 101 can be corrected from the deformation angle θ.

Sixth Embodiment

Figure 13:
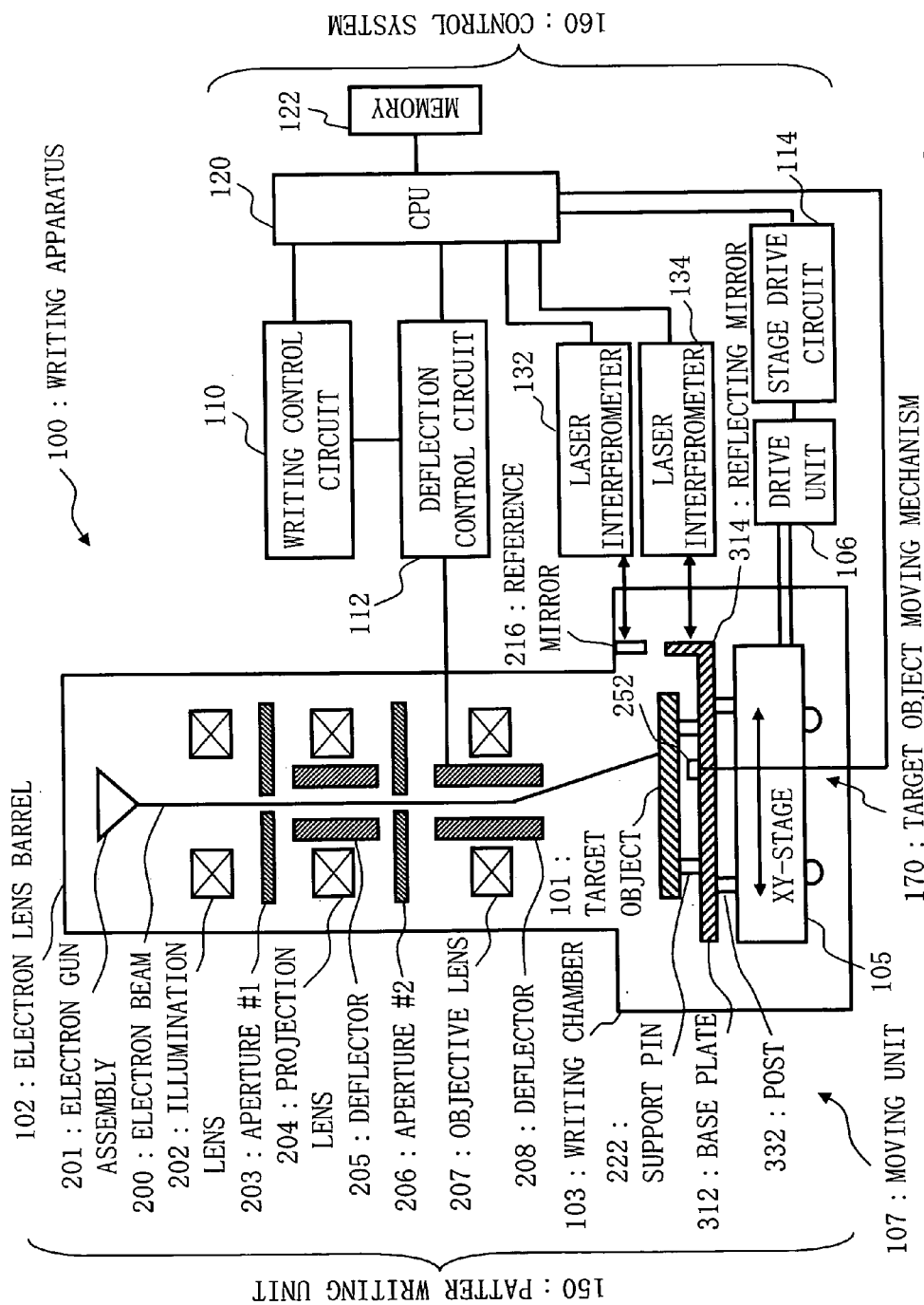
FIG. 13 is a block diagram showing a configuration of a writing apparatus according to a sixth embodiment of the invention.

FIG. 13 is a block diagram showing a configuration of a writing apparatus according to a sixth embodiment of the invention. In FIG. 13, the same target object moving mechanism 170 as that of the second embodiment is used in the pattern writing unit 150 serving as an example of an irradiation unit. The target object moving mechanism 170 includes the XY-stage 105, the base plate 312, the reflecting mirror 314, the reference mirror 216, the support pin 222, and the post 332. The target object moving mechanism 170 further includes an acceleration sensor 252. Other configurations of the fourth embodiment are similar to those of the first embodiment. Only the components necessary to explain the sixth embodiment are described in FIG. 13. The writing apparatus 100 may include other components.

The configurations and operations of the writing apparatus 100 of the sixth embodiment shown in FIG. 13 are the same as those of the writing apparatus 100 of the second embodiment except that the acceleration measuring device 252 is attached to the base plate 312 and the acceleration sensor 252 is connected to the CPU 120.

Figure 14:
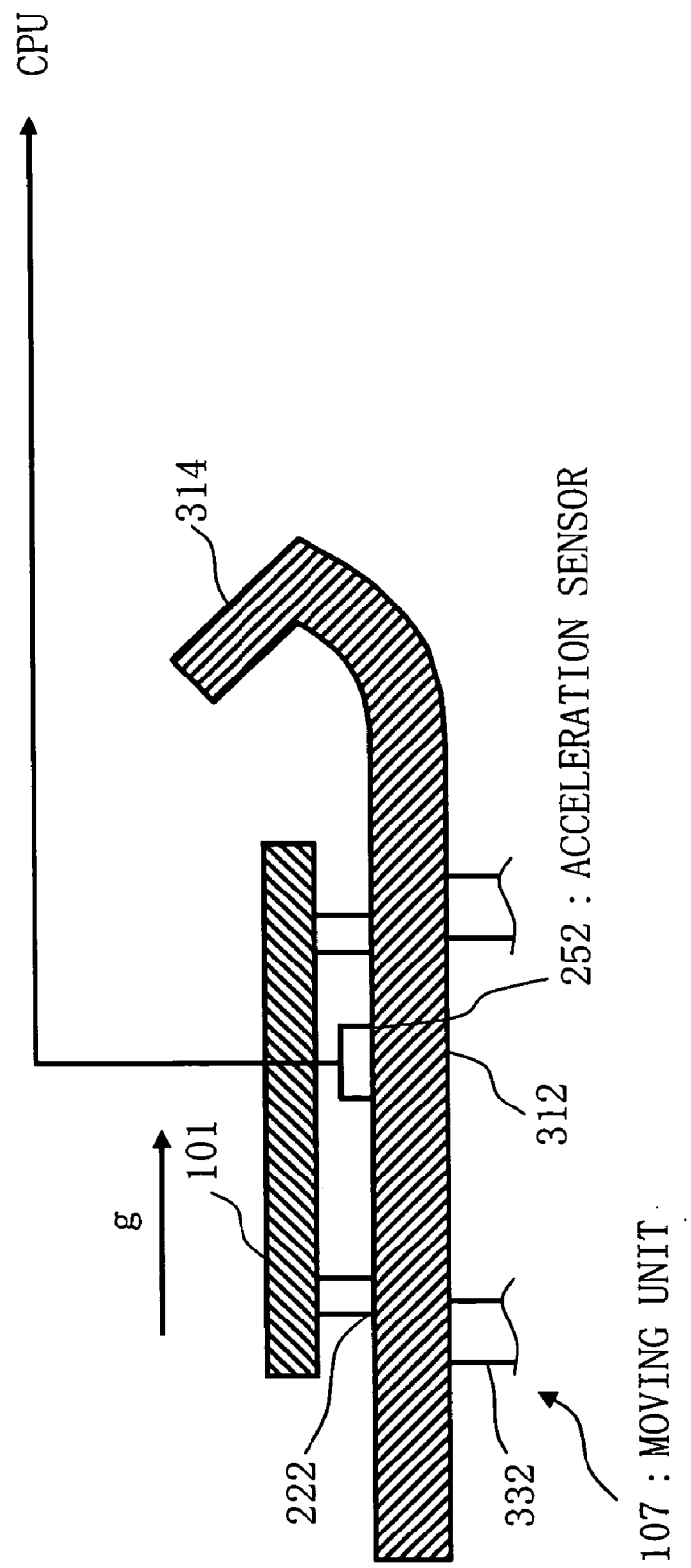
FIG. 14 is a schematic diagram for explaining a state in which acceleration is applied to the target object moving mechanism of the sixth embodiment.
Figure 15:
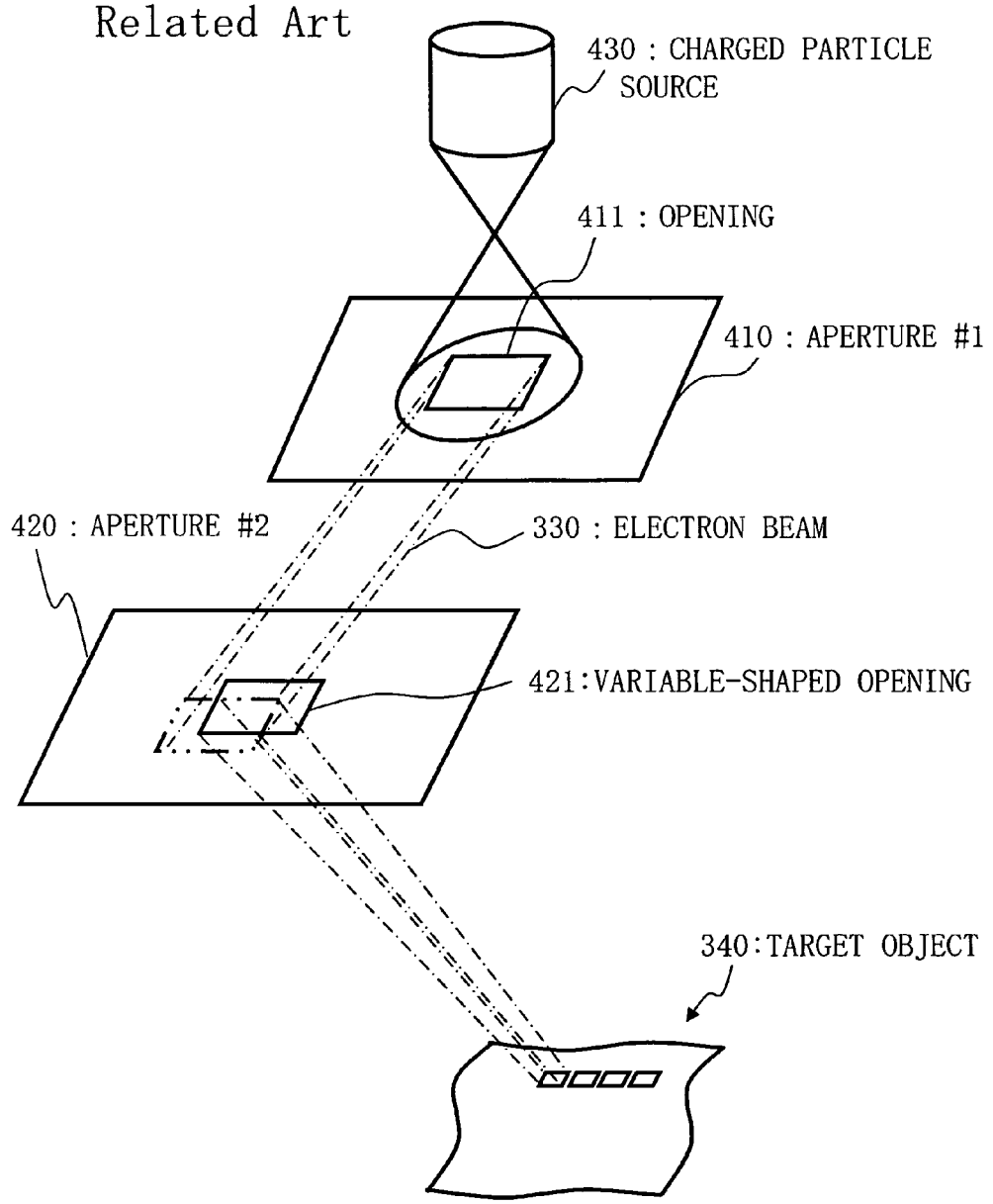
FIG. 15 is a conceptual view for explaining an operation of a conventional variable-shaped electron beam writing apparatus.

FIG. 14 is a schematic diagram for explaining a state in which acceleration is applied to the target object moving mechanism of the sixth embodiment. In FIG. 14, the XY-stage 105 and the post 332 are moved as the moving unit 107. When the moving unit 107 is horizontally moved with the acceleration G, the elastic deformation is generated in the base plate 312 by the mass M of the reflecting mirror 314, which displaces the reflecting mirror 314 toward the opposite direction to the accelerating direction. The acceleration sensor 252 is provided at the position where the deformation is not generated (position which is not strained) in the base plate 312, which allows the acceleration g to be measured in the base plate 312. Preferably, the acceleration sensor 252 is provided in the upper surface of the base plate 312. Alternatively, the acceleration sensor 252 may be provided in the lower surface of the base plate 312. The acceleration sensor 252 may be provided at any position as long as the acceleration g can be measured in the base plate 312.

Specifically, when the acceleration sensor 252 measures the acceleration g, the output of the acceleration sensor 252 is input to the CPU 120. As with the fourth embodiment, the CPU 120 outputs the signal corrected based on the product of the predetermined coefficient $k_2$ and the acceleration g to the deflection control circuit 112. The deflection control circuit 112 outputs the deflection signal is response to the signal, and the position to which the deflector 208 deflects the electron beam 200 is controlled by applying the deflection voltage to the deflector 208 from the deflection amplifier (not shown). In other words, the deflection control circuit 112 performs the control based on the acceleration g measured by the acceleration sensor 252 such that the position to which the deflector 208 deflects the electron beam 200 is matched with the position corrected based on the acceleration g. The deflector 208 deflects the electron beam 200 based on the acceleration measured by the acceleration sensor 252 using the signal from the deflection control circuit 112. Thus, in the writing apparatus 100 of the sixth embodiment, a pattern can be written at a desired position by deflecting the electron beam 200.

The embodiments of the invention are described above with reference to the specific examples. However, the invention is not limited to the above embodiments. For example, in the third embodiment, the displacement of the reflecting mirror 314 is computed from the amount of strain of the base plate 312. Alternatively, the strain gage may also be provided on the side of the target object 101 to measure both the displacements. In the fourth embodiment, the post-displacement position of the reflecting mirror 314 is corrected from the acceleration g. Alternatively, the position of the target object 101 may also be corrected, as a matter of course.

In the apparatus configuration, control method and the like, portions which are not directly necessary to describe the invention are neglected. However, the necessary apparatus configuration and control method can appropriately be selected and used. For example, although the configuration of the control unit which controls the writing apparatus 100 is neglected, the necessary configuration of the control unit can obviously be selected and used, as a matter of course.

It will be obvious to those skilled in the art that various modification and variations of the target object moving mechanism and the charged particle beam writing apparatus of the disclosed embodiments can be made without departing from the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a stage configured to carry a target object and further configured to be horizontally moved in an accelerating manner while a pattern is written on the target object;
an irradiation unit configured to irradiate a charged particle beam to the target object for writing the pattern;
an acceleration measurement unit configured to measure an acceleration associated with a movement of the stage while writing the pattern;
a deflector configured to deflect the charged particle beam to a position corrected based on the acceleration associated with the movement of the stage while writing the pattern; and
a deflection computation unit configured to perform a computation of an amount of the deflection of the charged particle beam, wherein the computation of an amount of the deflection includes a computation of a deformation associated with the stage.

2. The charged particle beam writing apparatus according to claim 1, further comprising:
a laser length measuring device configured to measure a stage position by using a laser beam;
a mirror part arranged in the stage to reflect the laser beam; and
a deflection control unit configured to perform control such that a position where the deflector deflects the charged particle beam is matched with the position corrected based on the acceleration,
wherein the acceleration measurement unit is configured to compute the acceleration from an amount of displacement of the stage position measured by the laser length measuring device.

3. The charged particle beam writing apparatus according to claim 1, wherein the acceleration is in a horizontal direction.

4. The charged particle beam writing apparatus according to claim 1, wherein the acceleration results from a variation in a speed of the stage according to a density of the pattern.

5. The charged particle beam writing apparatus according to claim 1 further comprising:

a plurality of posts configured to be arranged on the stage; and a base plate mounted on the plurality of posts and configured for placement of the target object thereon, wherein the acceleration includes an acceleration of the base plate induced by the stage speed change according to a density of the pattern while writing the pattern on the target object.

6. The charged particle beam writing apparatus according to claim 5, wherein the acceleration measurement unit includes an acceleration sensor attached to the base plate.

7. The charged particle beam writing apparatus according to claim 1, wherein the acceleration measurement unit includes an acceleration sensor attached to the stage.

8. The charged particle beam writing apparatus according to claim 1, wherein the stage includes a base plate and wherein the deformation is a deformation of the base plate.

9. The charged particle beam writing apparatus according to claim 1, wherein the deformation results from the acceleration.

10. The charged particle beam writing apparatus according to claim 8, wherein the deformation results from the acceleration.

11. The charged particle beam writing apparatus according to claim 2, wherein the acceleration measurement unit includes a differential computation unit configured to compute the acceleration by differentiating the amount of displacement.

* * * * *